(12) United States Patent
Wang et al.

(10) Patent No.: US 12,693,339 B2
(45) Date of Patent: Jul. 28, 2026

(54) ESTIMATION OF STATE OF CHARGE OF A BATTERY ASSEMBLY

(71) Applicant: GM Global Technology Operations LLC, Detroit, MI (US)

(72) Inventors: Yue-Yun Wang, Troy, MI (US); Chengwu Duan, Shanghai (CN); Chen-fang Chang, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 519 days.

(21) Appl. No.: 18/307,327

(22) Filed: Apr. 26, 2023

(65) Prior Publication Data

US 2024/0295608 A1 Sep. 5, 2024

(30) Foreign Application Priority Data

Mar. 1, 2023 (CN) .......................... 202310187861.4

(51) Int. Cl.
*G01R 31/382* (2019.01)
*B60L 50/64* (2019.01)
(Continued)

(52) U.S. Cl.
CPC ............ *G01R 31/382* (2019.01); *B60L 50/64* (2019.02); *B60L 58/12* (2019.02);
(Continued)

(58) Field of Classification Search
CPC .............. G01R 31/382; G01R 31/3648; G01R 31/392; G01R 31/396; B60L 50/64; B60L 58/12
See application file for complete search history.

(56) References Cited

U.S. PATENT DOCUMENTS 9,768,624 B2 9/2017 Becker et al.
10,641,836 B1 * 5/2020 Hou ..................... G01R 31/392
(Continued)

FOREIGN PATENT DOCUMENTS

CN 112262493 A 1/2021

OTHER PUBLICATIONS

German Office Action for German Application 102023107675.2 issued Dec. 21, 2023; 6 pages.

*Primary Examiner* — Ricky Go
(74) *Attorney, Agent, or Firm* — CANTOR COLBURN LLP

(57) ABSTRACT

A system for estimating a parameter of a battery assembly includes a sensing device connected to a cell of the battery assembly, the battery assembly having a first battery chemistry, the sensing device including a measurement cell having a second battery chemistry that is different than the first battery chemistry. The system includes an estimator configured to acquire a set of first estimates of a first state of charge (SOC) of the battery assembly, acquire a set of second estimates of a second SOC of the sensing device, and blend the sets of estimates to generate a blended SOC relation describing the second SOC of the sensing device as a function of the first SOC of the battery assembly. The estimator is also configured to filter the set of first estimates using the blended SOC relation to generate a final estimate of the SOC of the battery assembly.

20 Claims, 7 Drawing Sheets

(51) Int. Cl.
| | |
|---|---|
| *B60L 58/12* | (2019.01) |
| *G01R 31/36* | (2020.01) |
| *G01R 31/367* | (2019.01) |
| *G01R 31/392* | (2019.01) |

(52) U.S. Cl.
CPC ....... *G01R 31/3648* (2013.01); *G01R 31/367* (2019.01); *G01R 31/392* (2019.01)

(56)  References Cited

U.S. PATENT DOCUMENTS

| | | | |
|---|---|---|---|
| 2010/0256936 A1* | 10/2010 | Darilek | G01R 31/382 |
| | | | 324/427 |
| 2015/0081237 A1* | 3/2015 | Ye | B60L 3/12 |
| | | | 702/63 |
| 2018/0017630 A1 | 1/2018 | Schipfer | |
| 2019/0079136 A1 | 3/2019 | Lim et al. | |
| 2021/0215768 A1* | 7/2021 | Zhang | G01R 31/3842 |
| 2021/0223324 A1* | 7/2021 | Kondo | H02J 7/0048 |

* cited by examiner

ESTIMATION OF STATE OF CHARGE OF A BATTERY ASSEMBLY

CROSS-REFERENCE TO RELATED APPLICATIONS

This application claims the benefit of Chinese Application No. 202310187861.4 filed on Mar. 1, 2023, the disclosure of which is incorporated herein by reference in its entirety.

INTRODUCTION

Vehicles, including gasoline and diesel power vehicles, as well as electric and hybrid electric vehicles, feature battery storage for purposes such as powering electric motors, electronics and other vehicle subsystems. Monitoring a battery state of charge (SOC) is desirable in a variety of contexts, including supplying power to electric motors and other devices, monitoring vehicle charging, and monitoring the state of health of a battery. Accordingly, it is desirable to provide a device or system that can provide accurate SOC estimations under a variety of operating conditions.

SUMMARY

In one exemplary embodiment, a system for estimating a parameter of a battery assembly includes a sensing device connected in series to a battery cell of the battery assembly, the battery assembly having a first battery chemistry, the sensing device including a measurement cell having a second battery chemistry that is different than the first battery chemistry, and an estimator. The estimator is configured to acquire a set of first estimates of a first state of charge (SOC) of the battery assembly, acquire a set of second estimates of a second SOC of the sensing device, and blend the set of first estimates and the set of second estimates to generate a blended SOC relation, the blended SOC relation describing the second SOC of the sensing device as a function of the first SOC of the battery assembly. The estimator is also configured to filter the set of first estimates using the blended SOC relation to generate a final estimate of the SOC of the battery assembly, the final estimate having an accuracy that is greater than an accuracy of the set of first estimates.

In addition to one or more of the features described herein, the filtering is performed using a Kalman filter algorithm.

In addition to one or more of the features described herein, the blending is based on a ratio of a capacity of the battery assembly to a capacity of the sensing device.

In addition to one or more of the features described herein, the blended SOC relation is represented by:

$$SOC_{SD}(k) = \left(CAP_{BP}/CAP_{SD}\right) * SOC_{BP}(k) + d \% + v(i, T),$$

where $SOC_{SD}(k)$ is a state of charge of the sensing device for a plurality of measurement times k, $CAP_{BP}$ is a capacity of the battery assembly, $CAP_{SD}$ is a capacity of the sensing device, d % is a minimum charge offset, $SOC_{BP}(k)$ is a state of the charge of the battery assembly, and v(i,T) is a noise model of the sensing device based on a current i and a temperature T.

In addition to one or more of the features described herein, the set of first estimates is acquired based on a Coulomb counting process.

In addition to one or more of the features described herein, the set of second estimates is acquired based on a Coulomb counting process in combination with a battery state estimation process.

In addition to one or more of the features described herein, the estimator is further configured to determine a state of health of the battery assembly based on a capacity of the sensing device, a first offset value and a second offset value, the first offset value based on a difference between a SOC of the sensing device in a rest condition and a SOC of the battery cell in the rest condition, the second offset value based on a difference between a maximum SOC of the sensing device and a measured SOC of the sensing device.

In addition to one or more of the features described herein, the battery cell is part of a battery pack of a vehicle.

In another exemplary embodiment, a method of estimating a parameter of a battery assembly includes acquiring a set of first estimates of a first state of charge (SOC) of the battery assembly, the battery assembly having a first battery chemistry, and acquiring a set of second estimates of a second SOC of a sensing device connected in series to a battery cell of the battery assembly, the sensing device including a measurement cell having a second battery chemistry that is different than the first battery chemistry. The method also includes blending the set of first estimates and the set of second estimates to generate a blended SOC relation, the blended SOC relation describing the second SOC of the sensing device as a function of the first SOC of the battery assembly, and filtering the set of first estimates using the blended SOC relation to generate a final estimate of the SOC of the battery assembly. The final estimate has an accuracy that is greater than an accuracy of the set of first estimates.

In addition to one or more of the features described herein, the filtering is performed using a Kalman filter algorithm.

In addition to one or more of the features described herein, the blending is based on a ratio of a capacity of the battery assembly to a capacity of the sensing device.

In addition to one or more of the features described herein, the blended SOC relation is represented by:

$$SOC_{SD}(k) = \left(CAP_{BP}/CAP_{SD}\right) * SOC_{BP}(k) + d \% + v(i, T),$$

where $SOC_{SD}(k)$ is a state of charge of the sensing device for a plurality of measurement times k, $CAP_{BP}$ is a capacity of the battery assembly, $CAP_{SD}$ is a capacity of the sensing device, d % is a minimum charge offset, $SOC_{BP}(k)$ is a state of the charge of the battery assembly, and v(i,T) is a noise model of the sensing device based on a current i and a temperature T.

In addition to one or more of the features described herein, the set of first estimates is acquired based on a Coulomb counting process.

In addition to one or more of the features described herein, the set of second estimates is acquired based on a Coulomb counting process in combination with a battery state estimation process.

In addition to one or more of the features described herein, the method further includes determining a state of health of the battery assembly based on a capacity of the sensing device, a first offset value and a second offset value, the first offset value based on a difference between a SOC of the sensing device in a rest condition and a SOC of the battery cell in the rest condition, the second offset value based on a difference between a maximum SOC of the sensing device and a measured SOC of the sensing device.

In addition to one or more of the features described herein, the battery cell is part of a battery pack of a vehicle.

In yet another exemplary embodiment, a vehicle system includes a memory having computer readable instructions, and a processing device for executing the computer readable instructions, the computer readable instructions controlling the processing device to perform a method. The method includes acquiring a set of first estimates of a first state of charge (SOC) of a battery assembly, the battery assembly having a first battery chemistry, and acquiring a set of second estimates of a second SOC of a sensing device connected in series to a battery cell of the battery assembly, the sensing device including a measurement cell having a second battery chemistry that is different than the first battery chemistry. The method also includes blending the set of first estimates and the set of second estimates to generate a blended SOC relation, the blended SOC relation describing the second SOC of the sensing device as a function of the first SOC of the battery assembly, and filtering the set of first estimates using the blended SOC relation to generate a final estimate of the SOC of the battery assembly, the final estimate having an accuracy that is greater than an accuracy of the set of first estimates.

In addition to one or more of the features described herein, the filtering is performed using a Kalman filter algorithm.

In addition to one or more of the features described herein, the blending is based on a ratio of a capacity of the battery assembly to a capacity of the sensing device, and the blended SOC relation is represented by:

$$SOC_{SD}(k) = (CAP_{BP}/CAP_{SD}) * SOC_{BP}(k) + d \% + v(i, T),$$

where $SOC_{SD}(k)$ is a state of charge of the sensing device for a plurality of measurement times k, $CAP_{BP}$ is a capacity of the battery assembly, $CAP_{SD}$ is a capacity of the sensing device, d % is a minimum charge offset, $SOC_{BP}(k)$ is a state of the charge of the battery assembly, and v(i,T) is a noise model of the sensing device based on a current i and a temperature T.

In addition to one or more of the features described herein, the set of first estimates is acquired based on a Coulomb counting process, and the set of second estimates is acquired based on a Coulomb counting process in combination with a battery state estimation process.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
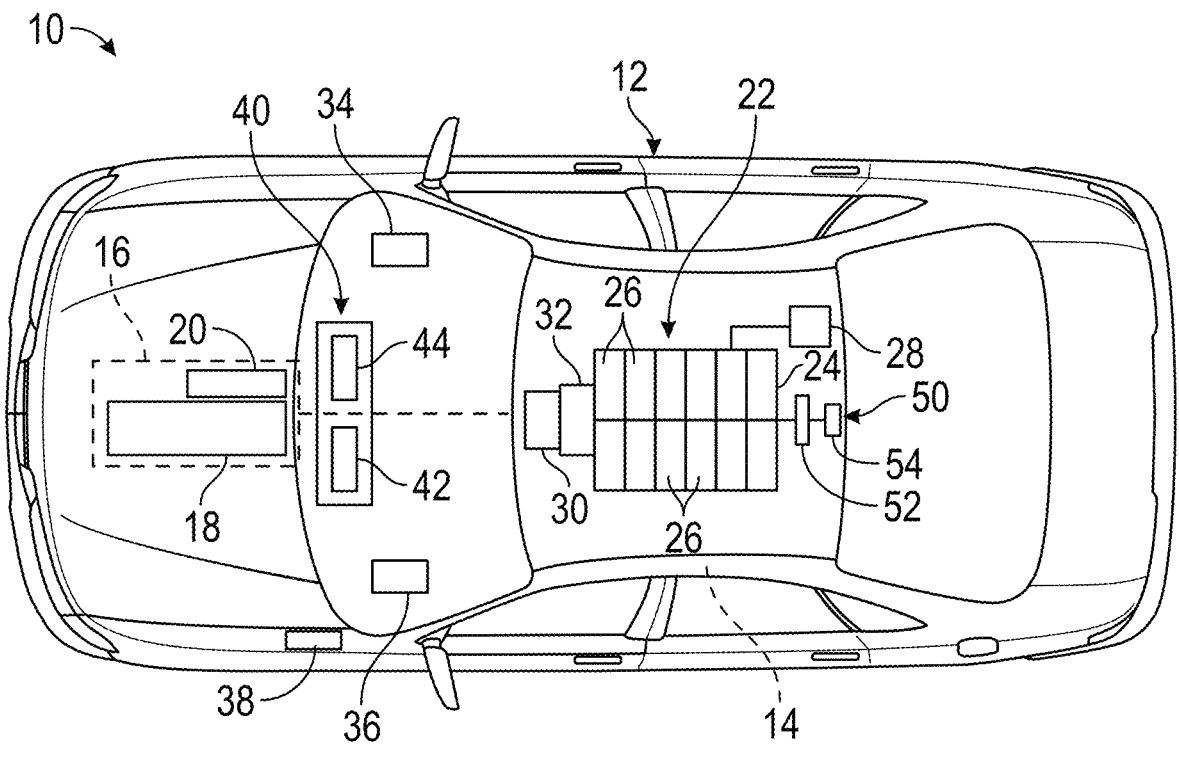
FIG. 1 is a top view of a motor vehicle including a battery assembly and a state of charge (SOC) estimation system, in accordance with an exemplary embodiment.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

In accordance with exemplary embodiments, methods, devices and systems are provided for estimating parameters of battery assemblies and battery systems, such as vehicle battery assemblies. An embodiment of a battery measurement system includes a sensing device connected in series to one or more cells of a battery assembly (e.g., a battery pack or module). The sensing device includes at least one battery cell (also referred to as a "sensing cell") that has a different battery chemistry than the chemistry of the battery assembly. For example, the battery assembly is a lithium-ferro phosphate or lithium iron phosphate (LFP) assembly, and the sensing device includes at least one nickel manganese cobalt (NCM) cell.

The measurement system includes a processing device (estimator) configured to estimate a state of charge (SOC) of the battery assembly (or at least one of the cells thereof) based on measurements of the battery assembly and the sensing device. In an embodiment, the SOC of the battery assembly is estimated by acquiring a set of initial estimates ("first estimates") of SOC of the battery assembly, acquiring a set of initial estimates ("second estimates") of SOC of the sensing device, and blending the sets of estimates. In an embodiment, the blending is performed according to a relation between an SOC of the sensing device and a ratio of a capacity (also referred to as a "state of health" or SOH) of the battery assembly and a capacity of the sensing device, to generate a set of blended estimates. The blended estimates are filtered (e.g., via Kalman filtering) or otherwise processed to generate an estimate (also referred to as a "final estimate") of the SOC of the battery assembly that has a higher accuracy than the acquired sets of initial estimates. Embodiments are also provided for calibrating the ratio and determining a SOH of the battery assembly.

Embodiments described herein present numerous advantages and technical effects. The embodiments provide for effective estimations of battery state of charge, and provide such estimations with an accuracy that is greater than the accuracy of other existing SOC estimation systems. Accurate SOC estimations improve the performance and reliability of battery assemblies and battery management systems, which helps to improve the performance and reliability of vehicle systems, and also helps to lengthen the lifetime of battery assemblies. For example, precise SOC estimation can avoid unpredicted system interruption and prevent batteries from being over charged and over discharged.

Since battery discharge and charge involve complex chemical and physical processes, it can be challenging to accurately and consistently estimate SOC under various operation conditions. For example, some existing techniques involve estimating SOC of a battery assembly based on open cell voltage (OCV). However, the SOC of some types of batteries, such as LFP batteries, cannot be easily determined from OCV due to a relatively flat charge-discharge curve (OCV-SOC curve). Embodiments described herein overcome these limitations.

The embodiments are not limited to use with any specific vehicle and may be applicable to various contexts. For example, embodiments may be used with automobiles, trucks, aircraft, construction equipment, farm equipment, automated factory equipment and/or any other device or system for which additional thermal control may be desired to facilitate a device or system's existing thermal control capabilities or features.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, a fuel injection subsystem, an exhaust subsystem and others.

The vehicle 10 may be a combustion engine vehicle, an electrically powered vehicle (EV) or a hybrid vehicle. In an embodiment, the vehicle 10 is a hybrid vehicle that includes a combustion engine system 18 and at least one electric motor assembly. In an embodiment, the propulsion system 16 includes an electric motor 20, and may include one or more additional motors positioned at various locations. The vehicle 10 may be a fully electric vehicle having one or more electric motors.

The vehicle 10 includes a battery system 22, which may be electrically connected to the motor 20 and/or other components, such as vehicle electronics. The battery system 22 may be configured as a rechargeable energy storage system (RESS). In an embodiment, the battery system 22 includes a battery assembly such as a high voltage battery pack 24 having a plurality of battery modules 26. The battery system 22 may also include a monitoring unit 28 that includes components such as a processor, memory, an interface, a bus and/or other suitable components.

Each battery module includes a plurality of cells (not shown) having a selected chemistry. In an embodiment, each cell is a lithium-ion battery, such as a lithium ferro-phosphate (LFP) battery or lithium nickel manganese cobalt oxide (NCM) battery. The battery pack 24 is not so limited and can have any suitable chemistry. Other examples include nickel-metal hydride and lead acid chemistries.

The battery system 22 is electrically connected to components of the propulsion system 16. The propulsion system also includes an inverter module 30 and a DC-DC converter module 32. The inverter module 30 (e.g., a traction power inverter unit or TPIM) converts direct current (DC) power from the battery system 22 to poly-phase alternating current (AC) power (e.g., three-phase, six-phase, etc.) to drive the motor 20.

Various control modules (electronic control modules or ECUs) may be included in the vehicle 10. For example, an auxiliary power module (APM) 34 is included for providing power to accessories (e.g., 12V loads). An on-board charger module (OBCM) 36 may be included, which connects the battery system 22 to a charge port 38, and controls aspects of charging the battery system 22 (e.g., from a charging station, grid or other vehicle) and/or providing charge to an external system (e.g., vehicle-to-vehicle charging and/or vehicle-to-grid charging).

The vehicle 10 also includes a computer system 40 that includes one or more processing devices 42 and a user interface 44. The various processing devices and units may communicate with one another via a communication device or system, such as a controller area network (CAN) or transmission control protocol (TCP) bus.

The battery system 22 and/or other vehicle system is configured to determine battery properties such as state of charge (SOC) using a SOC estimation system 50 that includes a sensing device 52 connected in series with the battery pack 24. The sensing device 52 includes one or more battery cells, and has a different chemistry than the chemistry of the battery pack 24. Although the sensing device 52 is shown as having a single battery cell, the sensing device 52 may have any number of cells. For example, the battery pack 24 is assembled from LFP cells, and the sensing device 52 includes one or more NCM cells.

The sensing device 52 and the battery pack 24 may have any suitable chemistries. In an embodiment, the battery pack 24 includes at least one lithium-ion cell that includes a first chemistry having a SOC that does not vary distinctly as a function of OCV level, such as a lithium iron phosphate (LFP) chemistry, a lithium iron manganese phosphate (LFMP) chemistry, a sodium ion chemistry, and others. In an embodiment, the sensing device 52 includes at least one lithium-ion cell that includes a second chemistry having a SOC that varies distinctly as a function of OCV level, such as nickel manganese cobalt (NCM), nickel cobalt aluminum (NCA), lithium-ion manganese (LMO), lithium cobalt (LCO), or the like. As discussed above, while a NCM battery's SOC varies distinctly by its OCV, an LFP battery's SOC level cannot be easily distinguished by its OCV due to the LFP battery's flat charge-discharge curve. Accordingly, in embodiments, the SOC of the sensing device 52 is used to determine the SOC of the battery pack 24 (or a battery cell or module).

The SOC estimation system 50 also includes a processing device or processor, such as an estimator 54 configured to estimate the SOC of the battery pack 24 based on measurements or estimates of parameters of the battery pack 24 and the sensing device 52. The sensing device 52 functions as a "virtual" sensor, and measurements acquired from the sensing device 52 are combined or blended with measurements of the battery pack 24 to substantially increase the accuracy of estimates of SOC of the battery pack 24.

The estimator 54 receives measurements of battery pack 24 and the sensing device 52, such as temperature T, current i, voltage $V_{SD}$ of the sensing device 52 and voltage $V_{BP}$ of the battery pack 24. A total voltage $V_t$ of the battery pack and sensing device is the sum of $V_{SD}$ and $V_{BP}$.

Figure 2:
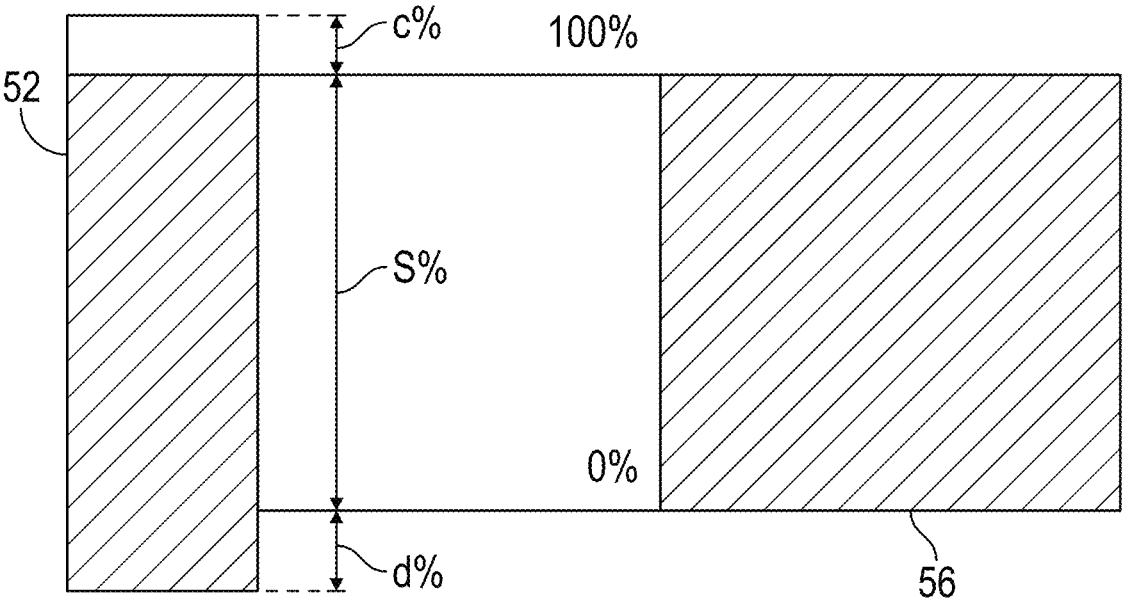
FIG. 2 depicts charging states and a configuration of a battery assembly and a sensing device, in accordance with an exemplary embodiment.

FIG. 2 depicts a cell 56 (e.g., a LFP cell) of the battery pack 24 and the sensing device 52. The sensing device 52 is configured as, for example, a NCM cell. The battery pack cell 56 and the sensing device 52 are configured such that a capacity $CAP_{SD}$ of the sensing device 52 is greater than a capacity $CAP_{BP}$ of the battery cell 56. In exemplary embodiments, the capacity $CAP_{BP}$ of the battery cell 56 is equal to the portion or percentage of the capacity $CAP_{SD}$ of the sensing cell multiplied by a scaling factor S %, which has a value of less than one (or less than 100%). For example, the capacity $CAP_{BP}$ of a new fully charged battery cell 56 is configured to be eighty-five percent of the capacity $CAP_{SD}$ of a new fully charged sensing cell, (i.e., the scaling factor is 0.85 or 85%).

The scaling factor S % can be calculated by subtracting a minimum offset value d % and a maximum offset value c % from 1, (i.e., S %+d %+c %=1 or 100%). The minimum offset value d % is a difference between a maximum capacity of the battery cell 56 and the sensing device 52 (in other words, when the battery cell charge or battery pack charge drops to zero, the sensing device drops to a charge corresponding to d %). The sensing device 52 has an initial charge that is less than a rated capacity of the sensing device 52 (i.e., is reduced according to a maximum offset value c %). In an embodiment, the minimum offset value d % is determined based on a minimum accurate sensing SOC level of the sensing device 52. In an embodiment, the maximum offset value c % (e.g., 5%) is selected to protect the sensing device 52 from being overcharged during charging of the battery pack 24 and the sensing device 52.

Figure 3:
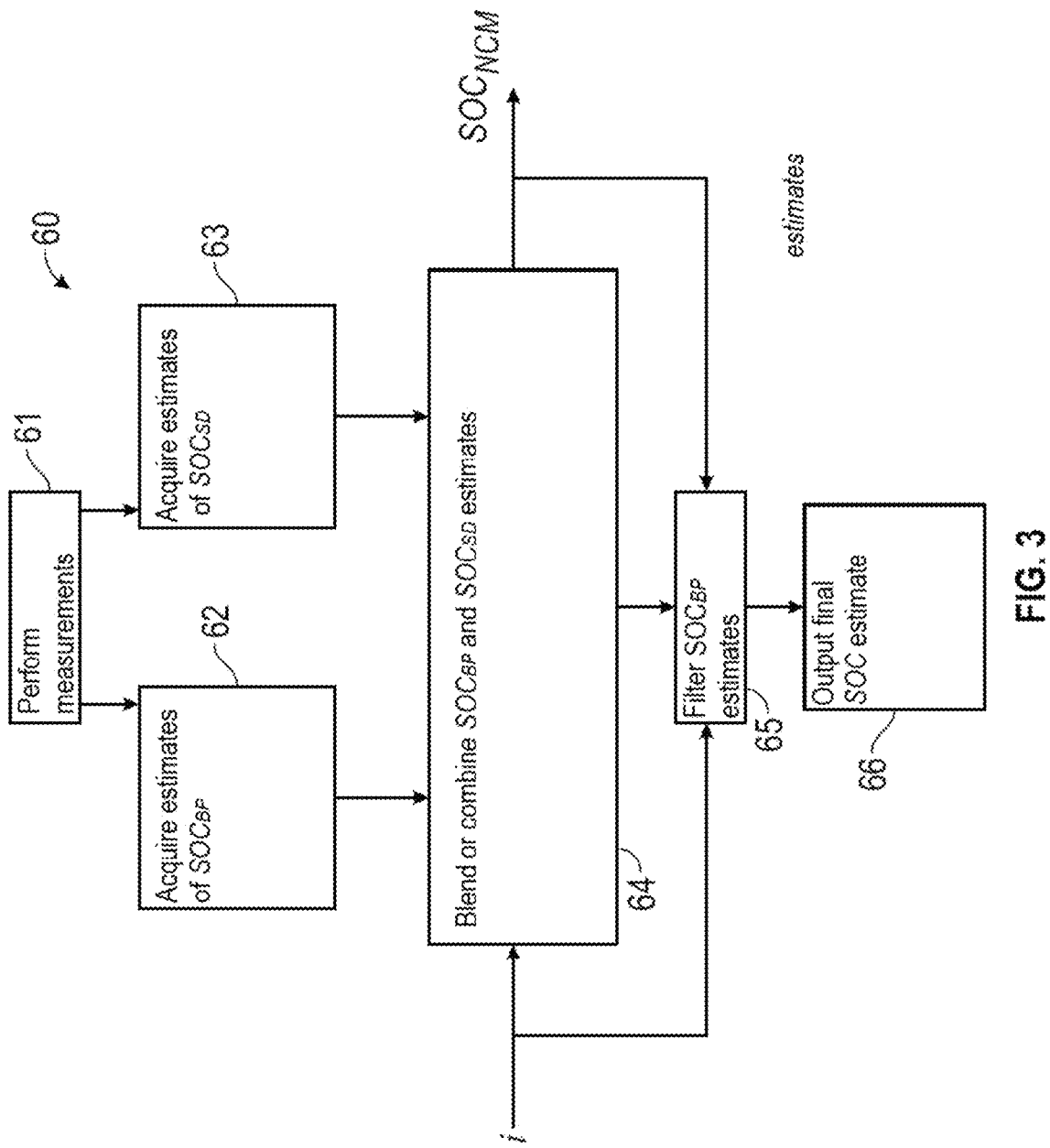
FIG. 3 is a flow diagram depicting aspects of a method of estimating a SOC of a battery assembly, in accordance with an exemplary embodiment.

FIG. 3 illustrates embodiments of a method 60 of estimating a state of charge of a battery assembly (e.g., the battery pack 24). Aspects of the method 60 may be performed by a processor or processors disposed in the vehicle 10 (e.g., the monitoring unit 28, estimator 54, etc.). It is noted that the method 60 is not so limited and may be performed by any suitable processing device or system, or combination of processing devices. In addition, the method 60 is not limited to use with the vehicle 10, as the method 60 may be performed in conjunction with any suitable battery or battery system.

The method 60 includes a number of steps or stages represented by blocks 61-66. The method 60 is not limited to the number or order of steps therein, as some steps represented by blocks 61-66 may be performed in a different order than that described below, or fewer than all of the steps may be performed.

The method 60 is discussed in conjunction with a battery pack, which may have multiple cells, and a sensing device having a single sensing cell. It is to be understood that the method 60 is not so limited, and can be applied to a battery system having any number of battery cells and a sensing device having any number of serially connected sensing cells. As described herein, a "battery pack" may refer to a single cell or multiple cells.

At block 61, the processing device monitors the battery system 22 and the sensing device 52. For example, measurements of voltage, current, temperature and/or other parameters are performed at a plurality of measurement times or sample times, indexed according to an integer k that is incrementally increased after each measurement time.

At block 62, the processing device performs or acquires a set of estimates of the $SOC_{BP}$ of the battery pack 24 (also referred to as a set of first estimates). The set of first estimates includes an estimate performed at each sample time k, and may be denoted as $SOC_{BP}(k)$. In an embodiment, the set of estimates $SOC_{BP}(k)$ is derived from a Coulomb counting technique, in which battery current (i) measurements are collected for each measurement time and integrated over a usage period. The set of estimates based on coulomb counting can be represented by:

$$SOC_{BP}(k+1) = SOC_{BP}(k) + (1/CAP_{BP}) * \int idt,$$

where $CAP_{BP}$ is the available battery pack capacity, and i is the current through the battery pack 24.

In an embodiment, the battery pack SOC estimates incorporate a noise model, which represents noise introduced into measurements by a current sensor or sensors. Thus, the set of estimates from Coulomb counting may be represented by:

$$SOC_{BP}(k+1) = SOC_{BP}(k) + (1/CAP_{BP}) * \int idt, +\varepsilon_k(i, T)$$

where $\varepsilon_k(i,T)$ is the noise model indicating levels of noise at various currents i and temperatures T.

At block 63, the SOC of the sensing device 52 (denoted as $SOC_{SD}$) is estimated. The $SOC_{SD}$ can be calculated using a Coulomb counting technique based on:

$$SOC_{SD}(k) = SOC_{SD}(k-1) + (1/CAP_{SD}) * \int idt,$$

where $CAP_{SD}$ is the available sensing device capacity, and i is the current through the battery pack 24.

In an embodiment, the capacity $CAP_{SD}$ of the sensing device 52 is calculated based on a combination of Coulomb counting and battery state estimation (BSE) techniques. In an embodiment, a battery state estimation technique includes calculating SOC of the sensing device 52 based on:

$$SOC = a(SOC_1) + (1-a) * SOC_2,$$

where a is a weighting factor that is less than one. $SOC_1$ represents the state of charge calculated from Coulomb counting, and $SOC_2$ represents the state of charge estimated using a Kalman filter. In exemplary embodiments, whenever an electric vehicle that includes a mixed chemistry battery system (i.e., a battery assembly having a different chemistry than a sensing device) is at rest for a sufficient amount of time, the calculated sensing cell SOC is reset to a more accurate value based on an OCV-SOC curve and the accurately measured OCV of the sensing cell.

At block 64, the set of estimates $SOC_{SD}(k)$ is blended or combined to generate a blended relation in which the $SOC_{SD}$ of the sensing device 52 is expressed as a function of the $SOC_{BP}$ of the battery pack 24. In an embodiment, the blended relation is also a function of a ratio of a measured or calculated capacity $CAP_{BP}$ of the battery pack 24 to a measured or calculated capacity $CAP_{SD}$ of the sensing device 52 (i.e., $CAP_{BP}$/CAP SD).

In an embodiment, the blended relation is represented by the following equation:

$$SOC_{SD}(k) = \left(CAP_{BP}/CAP_{SD}\right) * SOC_{BP}(k) + d \% + v(i, T)$$

where $v(i,T)$ is a noise model of the sensing device 52 indicating levels of noise at various currents $i$ and temperatures T.

At block 65, the first set of estimates is filtered using the blended SOC relation to generate an estimation (also referred to as a "final estimation" or "final estimate") of the SOC of the battery pack 24, the final estimation having an accuracy that is greater than an accuracy of the set of first estimates. For example, a Kalman filter or other suitable algorithm is used to reduce errors to that comparable to, or lower than, errors associated with both the battery assembly 56 and the sensing device 52.

At block 66, the more accurate final SOC estimate of the battery pack 24 is output or displayed. For example, a SOC curve or relation is provided (e.g., graphically, in a table, etc.) that represents estimates of SOC of the battery pack 24 over time.

The method 60 produces an estimation of SOC of a battery assembly that has a higher accuracy than traditional or existing techniques. For example, the SOC of an LFP battery pack or assembly can be estimated using Coulomb counting; however, such estimates can have a maximum error of up to 10%. The SOC of a NCM sensing device can be more accurately estimated with an error of up to 3%. The method 60 takes advantage of the ability to more accurately estimate the SOC of the NCM sensing device by combining such estimates with the relatively inaccurate estimates of the LFP battery pack through filtering techniques to reduce the error of an estimation of SOC of the battery pack to 3% or less.

Figure 4:
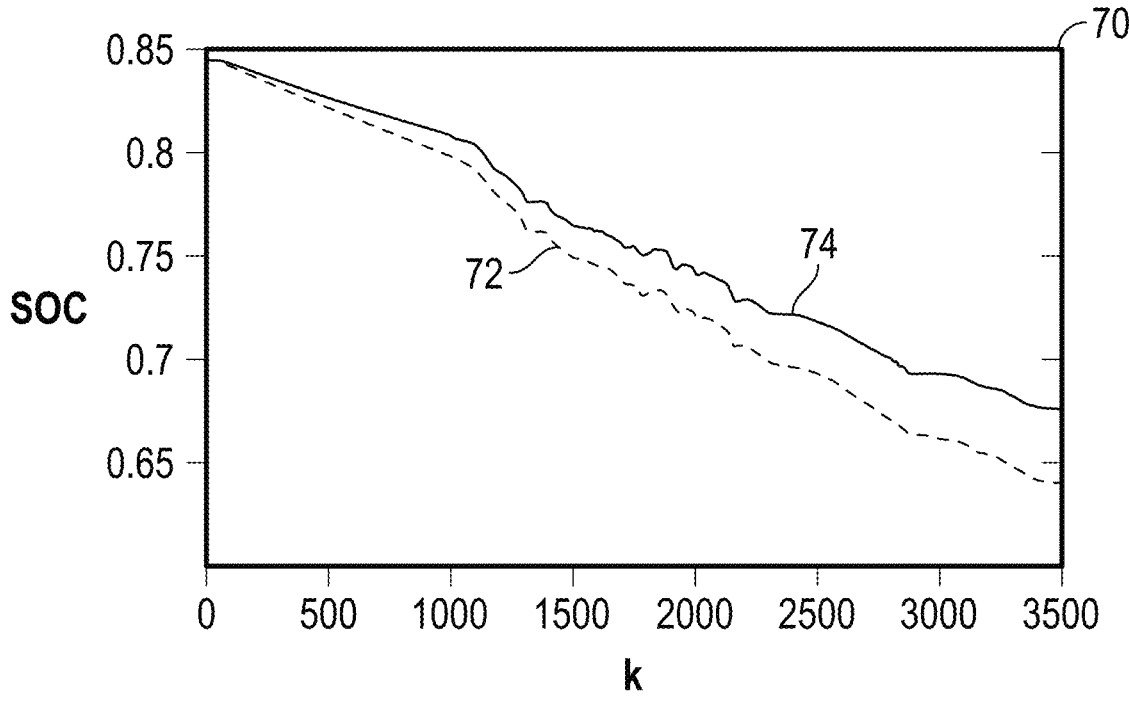
FIG. 4 depicts an example of a SOC curve generated based on current measurements and a Coulomb counting technique.

FIG. 4 depicts an example of SOC measurements performed using only measurements of current (and other appropriate parameters, such as temperature and voltage) without the use of the sensing device 52. FIG. 4 shows a graph 70 of SOC of an LFP battery pack as a function of time sample $k$, derived from current measurements and Coulomb counting. The measured SOC is shown as a curve 72, and is shown in comparison with a reference curve 74. As shown, the SOC diverges from the reference curve 74 due to high current sensor noise.

Figure 5:
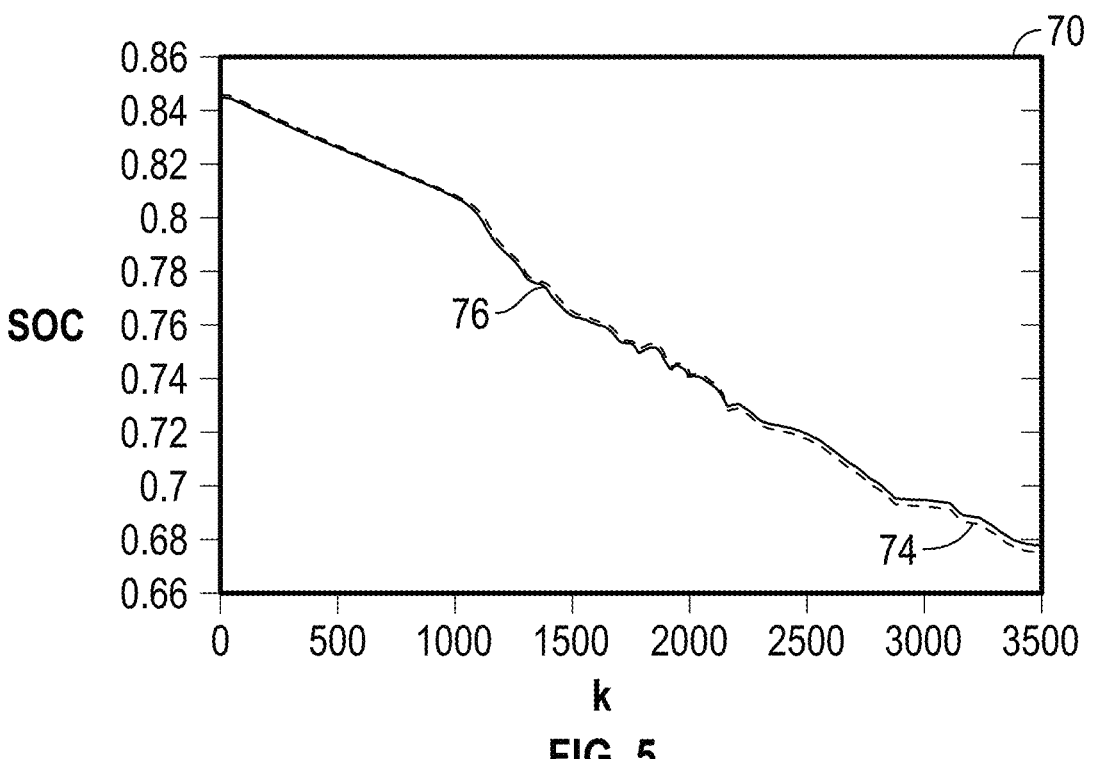
FIG. 5 depicts an example of a SOC curve generated based on the method of FIG. 3.

FIG. 5 shows a curve 76 representing the SOC of the LFP battery pack as estimated using the method 60. As can be seen, the accuracy of the SOC estimates are improved, as shown by the relatively small error between the curve 76 and the reference curve 74.

Figure 6:
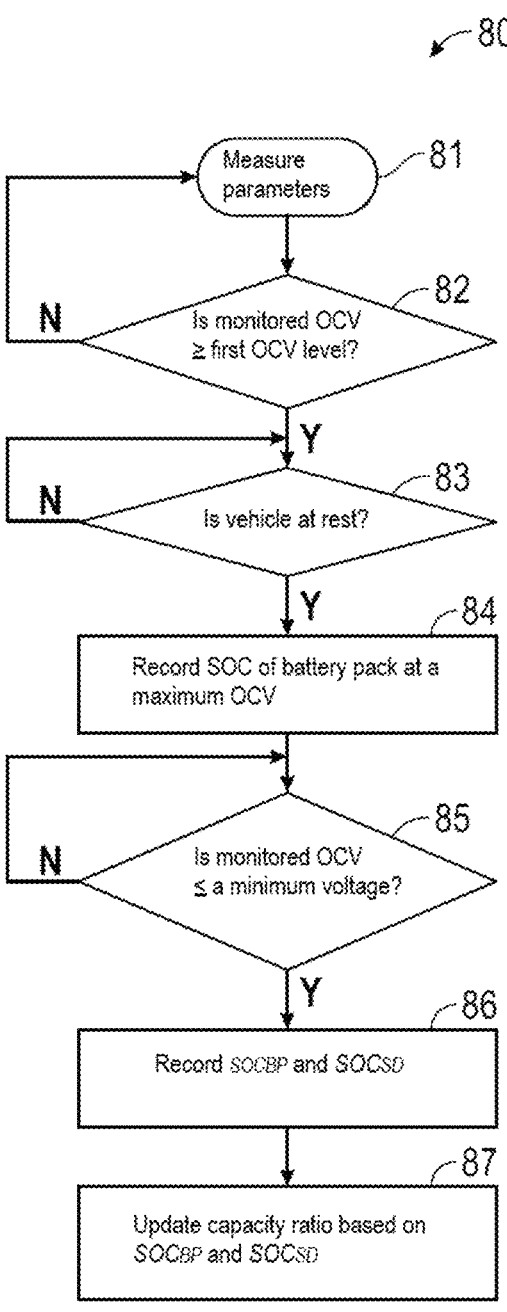
FIG. 6 is a flow diagram depicting aspects of a method of calibrating a ratio of a capacity or state of health (SOH) SOH (or capacity) of a battery assembly to a capacity or SOH of a sensing device, in accordance with an exemplary embodiment.

FIG. 6 illustrates embodiments of a method 80 of calibrating the capacity ratio $CAP_{BP}/CAP_{SD}$, which may be performed by the estimator 54 or any other suitable processing device or processor. The method 80 includes a number of steps or stages represented by blocks 81-87. The method 80 is not limited to the number or order of steps therein, as some steps represented by blocks 81-87 may be performed in a different order than that described below, or fewer than all of the steps may be performed.

The method 80 is discussed in conjunction with an example in which the battery pack 24 is a LFP battery pack and the sensing device 52 is a NCM sensing device. The method 80 is not so limited and is applicable to any of various chemistries.

At block 81, the method 80 starts by measuring parameters including OCV and current through the battery pack 24 and the sensing device 52. A first OCV level is selected, which corresponds to the OCV when the battery pack 24 and the sensing device 52 are at rest for a certain period of time. In an embodiment, the first OCV level is selected based on an OCV-SOC curve for each of the battery pack 24 and the sensing device 52.

Figure 7:
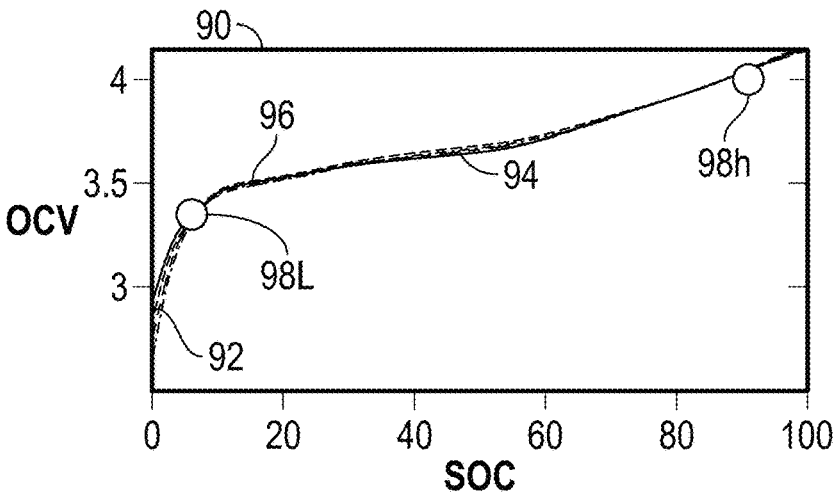
FIG. 7 depicts examples of open circuit voltage (OCV) curves of a battery assembly and a sensing device.
Figure 7:
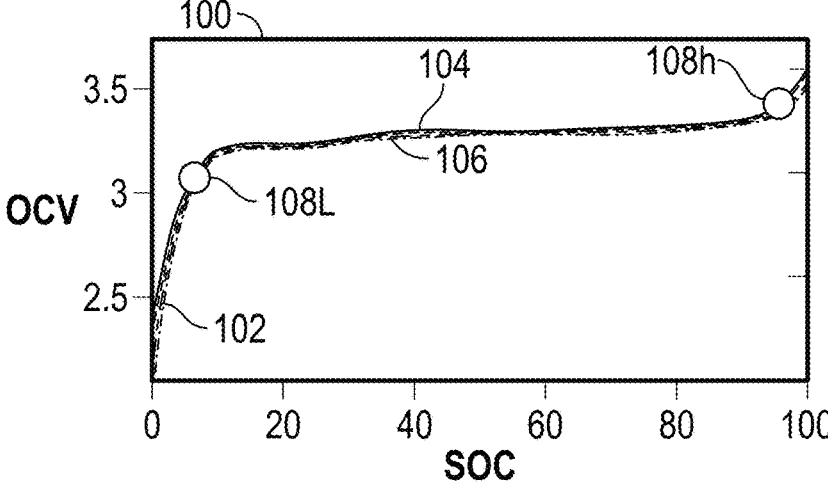

FIG. 7 depicts examples of OCV-SOC curves for a LFP battery pack and a NCM sensing device. Graph 90 includes curves representing the OCV of the NCM sensing device as a function of SOC for a range of temperatures. A curve 92 represents OCV for a new or fresh NCM sensing device at 25 degrees Celsius (C), a curve 94 represents a fresh NCM sensing cell at 10 degrees C., and a curve 96 represents an aged NCM sensing cell at 25 degrees C. Another curve (not shown but similar to the other curves) represents a fresh NCM sensing cell at 40 degrees C. A first SOC level $SOC_{SD}(h)$ (corresponding to point 98$h$ in FIG. 7) is selected for a maximum OCV (e.g., 4 V). A second SOC level $SOC_{SD}(L)$ (corresponding to point 98L in FIG. 7) is selected at a minimum voltage, i.e., a point near or at a part of the curves that begin to flatten out (e.g., about 3.4 V).

Graph 100 includes OCV-SOC curves representing the OCV of the LFP battery pack as a function of SOC for a range of temperatures. A curve 102 represents OCV for a new or fresh LFP battery pack at 25 degrees Celsius (C), a curve 104 represents a fresh LFP battery pack at 10 degrees C., and a curve 106 represents an aged LFP battery pack at 25 degrees C. Another curve (not shown but similar to the other curves) represents a fresh LFP battery pack at 40 degrees C. A first SOC level $SOC_{BP}(h)$ (corresponding to point 108$h$ in FIG. 8) is selected for a maximum OCV (e.g., 3.4 V). A second SOC level $SOC_{BP}(L)$ (corresponding to point 108L in FIG. 8) is selected at a minimum voltage, i.e., a point near or at a part of the curves that begin to flatten out (e.g., 3.1 V).

At block 82, the battery pack 24 and the sensing device 52 are charged and the battery pack OCV is monitored until the monitored OCV is greater than or equal to the first OCV level $SOC_{BP}(h)$ (e.g., 3.4 V).

At block 83, a processing device (e.g., the estimator 54) determines whether the vehicle is at rest for a selected amount of time. If the vehicle is not at rest, charging stops and the processing device again determines whether the vehicle is at rest.

At block 84, if the vehicle is at rest for at least the selected amount of time, the $SOC_{BP}(h)$ of the battery pack 24 at the maximum OCV is recorded. The $SOC_{SD}(h)$ of the sensing device 52 at the maximum OCV is recorded.

At block 85, the OCV of the battery pack is again monitored and compared to a minimum voltage. The processing device determines whether the OCV is less than or equal to the minimum voltage. If the OCV is higher than the minimum voltage, the battery pack 24 is allowed to continue operating.

At block 86, if the monitored OCV of the battery pack 24 is less than or equal to the minimum voltage selected for the battery pack and the vehicle is at rest for the selected amount of time, the $SOC_{BP}(L)$ of the battery pack 24 at the minimum OCV is recorded. The $SOC_{SD}(L)$ of the sensing device 52 at the minimum OCV is recorded.

At block 87, the capacity ratio $CAP_{BP}/CAP_{SD}$ is updated based on the SOC estimates. In an embodiment, if the battery temperature is kept within a selected range (e.g., a range including the temperatures for which the OCV-SOC curves were generated), the updated or calibrated capacity ratio is calculated based on:

$$\frac{CAP_{BP}}{CAP_{SD}} = \frac{SOC_{BP}(h) - SOC_{BP}(L)}{SOC_{SD}(h) - SOC_{SD}(L)}.$$

In an embodiment, a processing device (e.g., the estimator 54 or other suitable processor) is configured to estimate a state of health of a battery assembly. The state of health (SOH) describes a difference between a measured or calculated battery capacity and a fresh battery, and is related to cell aging.

Figure 8:
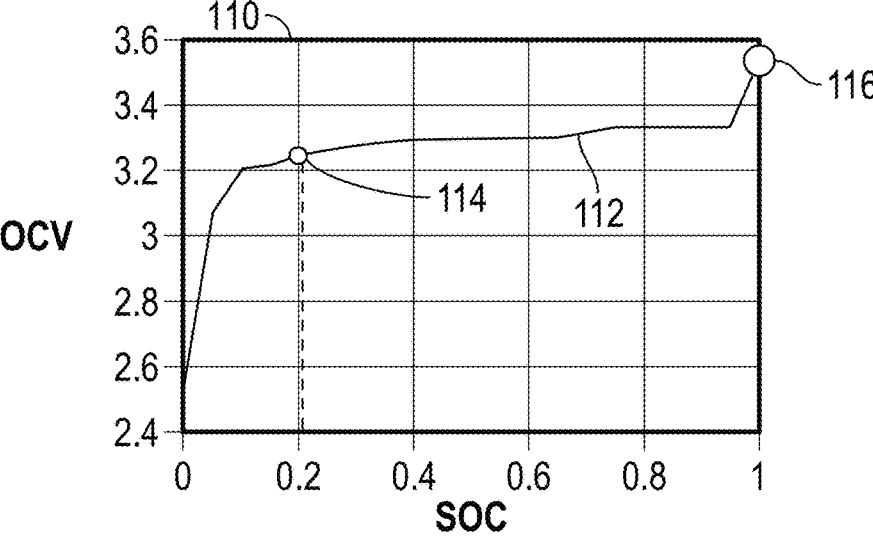
FIG. 8 depicts an example of an OCV curve of a battery assembly.
Figure 9:
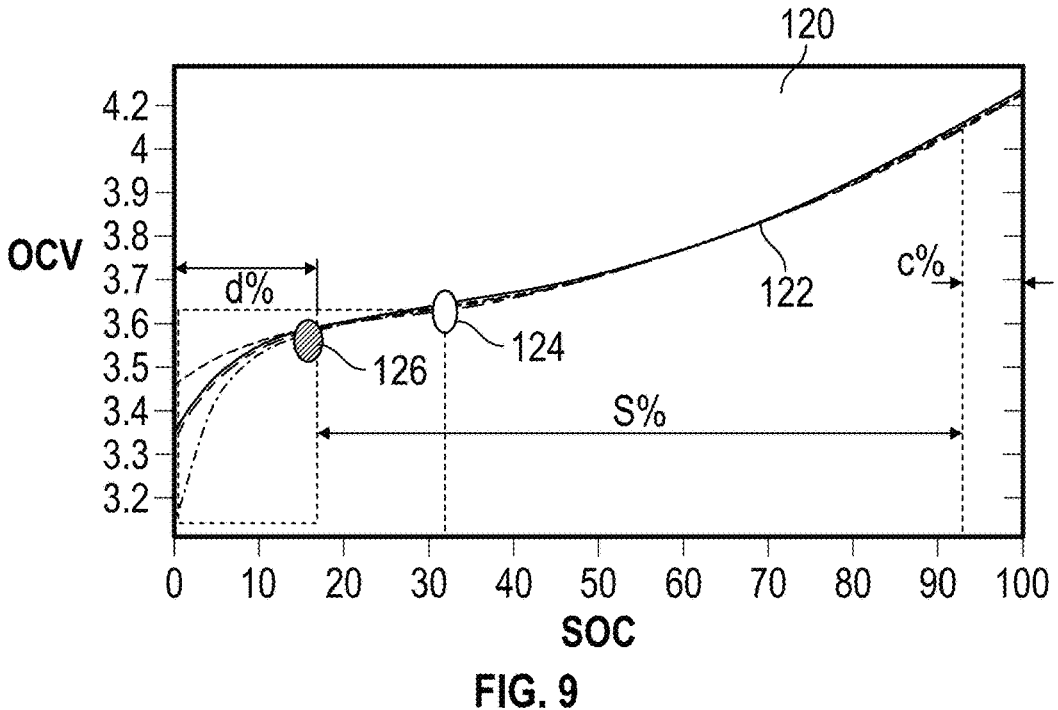
FIG. 9 depicts an example of an OCV curve of a sensing device.

An embodiment of a method of estimating SOH is discussed in conjunction with FIGS. 8 and 9. Although this method is discussed in conjunction with a LFP battery pack and a NCM sensing device, the method is not limited to these chemistries.

FIG. 8 shows a graph 110 including an example of a OCV-SOC curve 112 for an LFP battery pack (e.g., the battery pack 24). A rest point 114 corresponds to a SOC ($SOC_{BP}$(rest)) of the battery pack selected at or near a point before the curve flattens out (e.g., SOC 20%). A point 116 corresponds to a maximum SOC.

FIG. 9 shows a graph 120 including a set of OCV-SOC curves 122 of a NCM sensing cell or sensing device at various temperatures. A rest point 124 corresponds to a value of SOC ($SOC_{SD}$(rest)), which is the same as or similar to the rest point of the LFP battery pack. The offset d % is shown as a difference between an SOC of zero and the SOC at point 126.

The method includes determining a value for d %. The remaining charge of the LFP battery pack can be estimated based on:

$$\int idt = (SOC_{BP}(\text{rest})) * CAP_{BP}.$$

The offset d % for the NCM sensing device can be calculated based on:

$$d \% = SOC_{SD}(\text{rest}) - SOC_{BP}(\text{rest}) * \left(CAP_{BP}/CAP_{SD}\right).$$

The LFP battery pack is charged to full voltage for full charge (SOC=1 or 100%), and $SOC_{SD}$ is equated with c %. The LFP capacity, which corresponds to the SOH, is then calculated based on d % and c % and the capacity of the NCM sensing device as follows:

$$CAP_{BP} = \left((100\% - d \% - c \%)/100\%\right) * CAP_{BP}.$$

Figure 10:
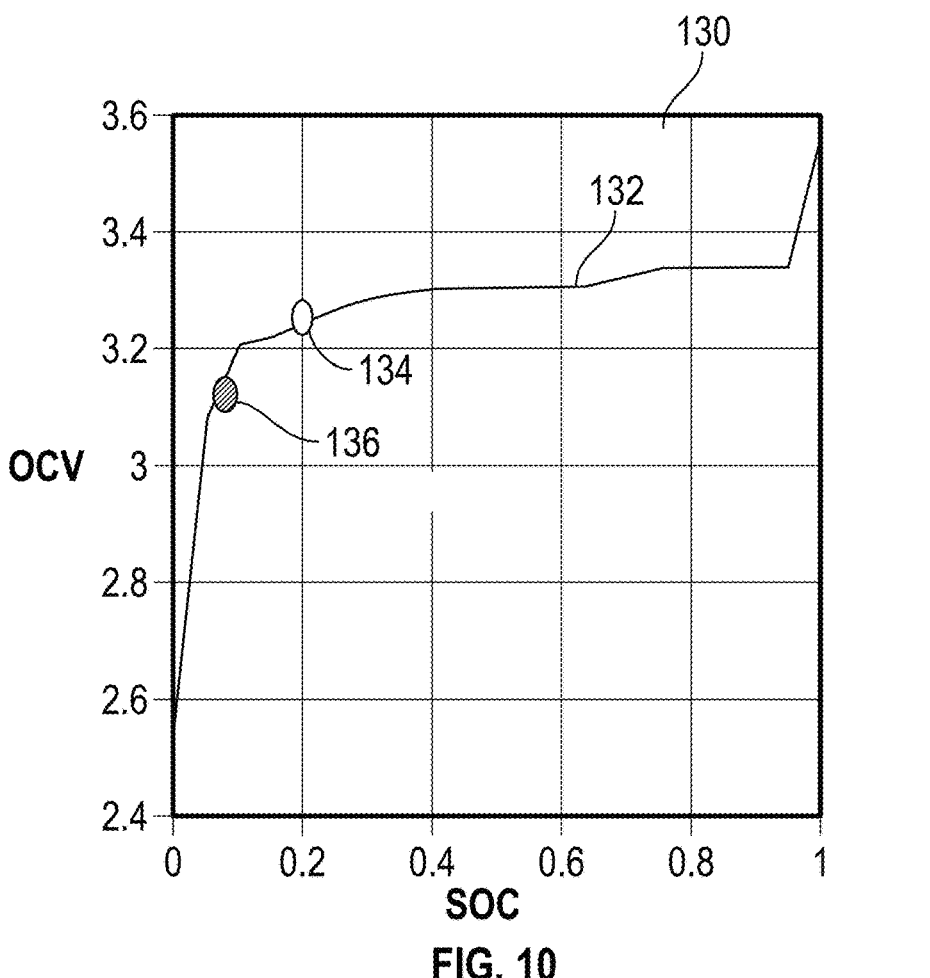
FIG. 10 depicts an example of an OCV curve of a battery assembly during charging and/or discharging.

Capacity estimation may be performed during vehicle charging (e.g., Level 1 and/or Level 2 charging). If the SOC of a battery pack before charging is close to a rest point at or near the flattening out portion of an OCV-SOC curve of the battery pack, the SOC before charging and the rest point can be used to estimate the battery pack capacity (SOH). FIG. 10 shows a graph 130 including an example of an OCV-SOC curve 132 of the battery pack 24. An initial SOC before charging is referred to as a first rest point, an example of which is shown as rest point 134. A second rest point is selected at a further lower SOC point, and example of which is shown as rest point 136. The capacity $CAP_{BP}$ can then be calculated based on:

$$CAP_{BP} = \int idt/(SOC_{BP}(2) - SOC_{BP}(1)),$$

where $SOC_{BP}(2)$ is the battery pack SOC at the second rest point, and $SOC_{BP}(1)$ is the battery pack capacity at the first rest point.

Figure 11:
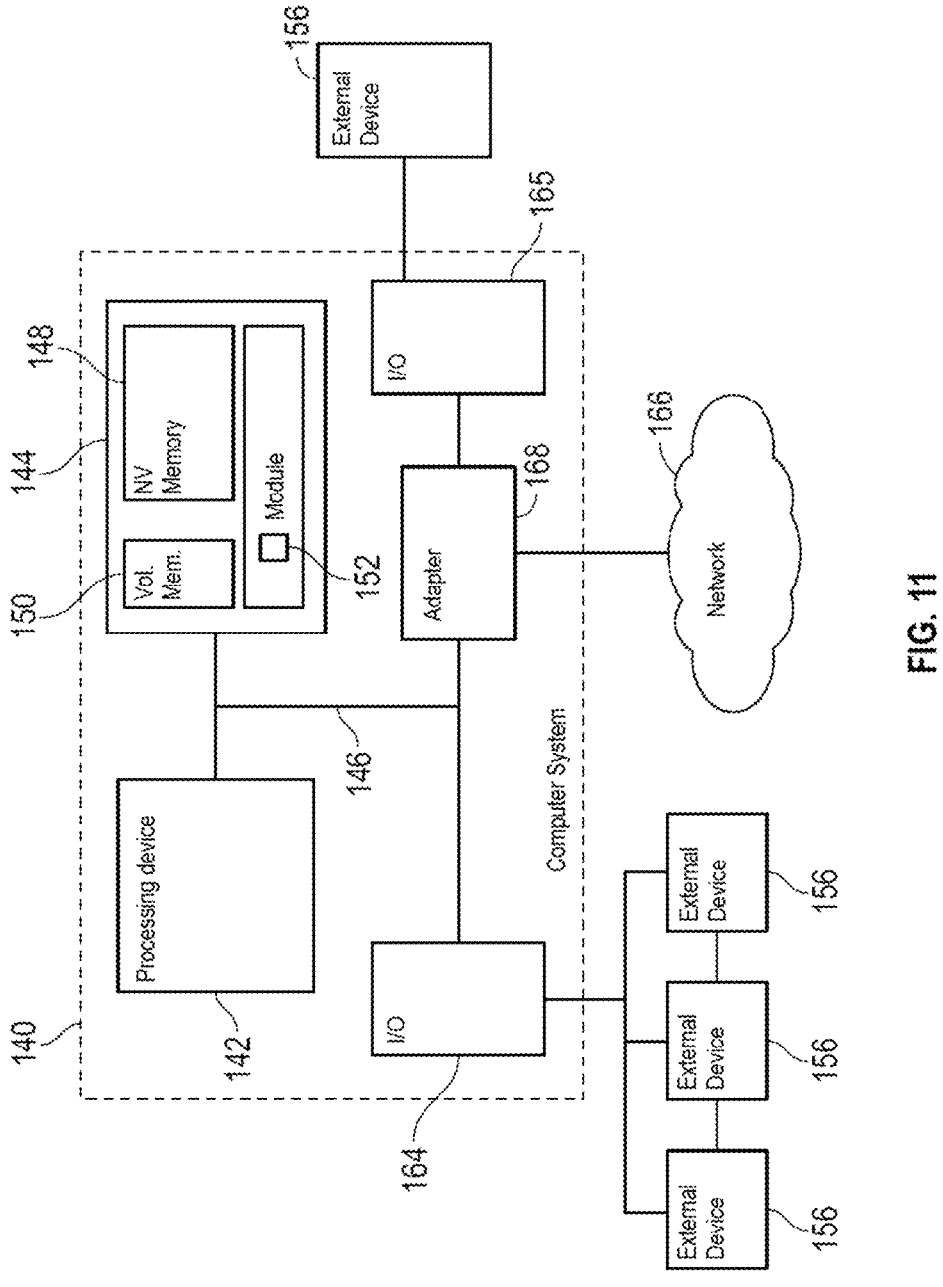
FIG. 11 depicts a computer system in accordance with an exemplary embodiment.

FIG. 11 illustrates aspects of an embodiment of a computer system 140 that can perform various aspects of embodiments described herein. The computer system 140 includes at least one processing device 142, which generally includes one or more processors for performing aspects of image acquisition and analysis methods described herein.

Components of the computer system 140 include the processing device 142 (such as one or more processors or processing units), a memory 144, and a bus 146 that couples various system components including the system memory 144 to the processing device 142. The system memory 144 can be a non-transitory computer-readable medium, and may include a variety of computer system readable media. Such media can be any available media that is accessible by the processing device 142, and includes both volatile and non-volatile media, and removable and non-removable media.

For example, the system memory 144 includes a non-volatile memory 148 such as a hard drive, and may also include a volatile memory 150, such as random access memory (RAM) and/or cache memory. The computer system 140 can further include other removable/non-removable, volatile/non-volatile computer system storage media.

The system memory 144 can include at least one program product having a set (e.g., at least one) of program modules that are configured to carry out functions of the embodiments described herein. For example, the system memory 144 stores various program modules that generally carry out the functions and/or methodologies of embodiments described herein. A module or modules 152 may be included to perform functions related to SOC and other battery assembly measurements and estimations as discussed herein. The system 140 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 142 can also communicate with one or more external devices 156 as a keyboard, a pointing device, and/or any devices (e.g., network card, modem, etc.) that enable the processing device 142 to communicate with one or more other computing devices. Communication with various devices can occur via Input/Output (I/O) interfaces 164 and 165.

The processing device 142 may also communicate with one or more networks 166 such as a local area network (LAN), a general wide area network (WAN), a bus network and/or a public network (e.g., the Internet) via a network adapter 168. It should be understood that although not shown, other hardware and/or software components may be used in conjunction with the computer system 140.

Examples include, but are not limited to: microcode, device drivers, redundant processing units, external disk drive arrays, RAID systems, and data archival storage systems, etc.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A system for estimating a state of charge (SOC) of a battery assembly, comprising:

a sensing device connected in series to a battery cell of the battery assembly, the battery assembly having a first battery chemistry, the sensing device including a measurement cell having a second battery chemistry that is different than the first battery chemistry;

an estimator configured to perform:

acquiring a set of first estimates of a first state of charge (SOC) of the battery assembly, the set of first estimates based on a measurement of a parameter of the battery assembly performed at a set of sample times;

acquiring a set of second estimates of a second SOC of the sensing device, the set of second estimates based on a measurement of the parameter of the sensing device at the set of sample times;

blending the set of first estimates and the set of second estimates to generate a blended SOC relation, the blended SOC relation describing the second SOC of the sensing device as a function of the first SOC of the battery assembly; and filtering the set of first estimates using the blended SOC relation to generate a final estimate of the SOC of the battery assembly, the final estimate having an accuracy that is greater than an accuracy of the set of first estimates; and a charger module configured to control a charging operation based on the final estimate of the SOC of the battery assembly.

2. The system of claim 1, wherein the filtering is performed using a Kalman filter algorithm.

3. The system of claim 1, wherein the blending is based on a ratio of a capacity of the battery assembly to a capacity of the sensing device.

4. The system of claim 3, wherein the blended SOC relation is represented by:

$$SOC_{SD}(k) = (CAP_{BP}/CAP_{SD}) * SOC_{BP}(k) + d \% + v(i, T),$$

wherein $SOC_{SD}(k)$ is a state of charge of the sensing device for a plurality of measurement times k, $CAP_{BP}$ is a capacity of the battery assembly, $CAP_{SD}$ is a capacity of the sensing device, d % is a minimum charge offset, $SOC_{BP}(k)$ is a state of the charge of the battery assembly, and v(i,T) is a noise model of the sensing device based on a current i and a temperature T.

5. The system of claim 1, wherein the set of first estimates is acquired based on a Coulomb counting process.

6. The system of claim 5, wherein the set of second estimates is acquired based on a Coulomb counting process in combination with a battery state estimation process.

7. The system of claim 1, wherein the estimator is further configured to determine a state of health of the battery assembly based on a capacity of the sensing device, a first offset value and a second offset value, the first offset value based on a difference between a SOC of the sensing device in a rest condition and a SOC of the battery cell in the rest condition, the second offset value based on a difference between a maximum SOC of the sensing device and a measured SOC of the sensing device.

8. The system of claim 1, wherein the battery cell is part of a battery pack of a vehicle.

9. A method of estimating a state of charge (SOC) of a battery assembly, comprising:

acquiring a set of first estimates of a first state of charge (SOC) of the battery assembly, the battery assembly having a first battery chemistry, the set of first estimates based on a measurement of a parameter of the battery assembly performed at a set of sample times;

acquiring a set of second estimates of a second SOC of a sensing device connected in series to a battery cell of the battery assembly, the sensing device including a measurement cell having a second battery chemistry that is different than the first battery chemistry, the set of second estimates based on a measurement of the parameter of the sensing device at the set of sample times;

blending the set of first estimates and the set of second estimates to generate a blended SOC relation, the blended SOC relation describing the second SOC of the sensing device as a function of the first SOC of the battery assembly;

filtering the set of first estimates using the blended SOC relation to generate a final estimate of the SOC of the battery assembly, the final estimate having an accuracy that is greater than an accuracy of the set of first estimates; and controlling a charging operation based on the final estimate of the SOC of the battery assembly.

10. The method of claim 9, wherein the filtering is performed using a Kalman filter algorithm.

11. The method of claim 9, wherein the blending is based on a ratio of a capacity of the battery assembly to a capacity of the sensing device.

12. The method of claim 11, wherein the blended SOC relation is represented by:

$$SOC_{SD}(k) = \left(CAP_{BP}/CAP_{SD}\right) * SOC_{BP}(k) + d\ \% + v(i,\ T),$$

wherein $SOC_{SD}(k)$ is a state of charge of the sensing device for a plurality of measurement times k, $CAP_{BP}$ is a capacity of the battery assembly, $CAP_{SD}$ is a capacity of the sensing device, d % is a minimum charge offset, $SOC_{BP}(k)$ is a state of the charge of the battery assembly, and v(i,T) is a noise model of the sensing device based on a current i and a temperature T.

13. The method of claim 9, wherein the set of first estimates is acquired based on a Coulomb counting process.

14. The method of claim 13, wherein the set of second estimates is acquired based on a Coulomb counting process in combination with a battery state estimation process.

15. The method of claim 9, further comprising determining a state of health of the battery assembly based on a capacity of the sensing device, a first offset value and a second offset value, the first offset value based on a difference between a SOC of the sensing device in a rest condition and a SOC of the battery cell in the rest condition, the second offset value based on a difference between a maximum SOC of the sensing device and a measured SOC of the sensing device.

16. The method of claim 9, wherein the battery cell is part of a battery pack of a vehicle.

17. A vehicle system comprising:
a memory having computer readable instructions; and
a processing device for executing the computer readable instructions, the computer readable instructions controlling the processing device to perform a method including:
acquiring a set of first estimates of a first state of charge (SOC) of a battery assembly, the battery assembly having a first battery chemistry, the set of first estimates based on a measurement of a parameter of the battery assembly performed at a set of sample times;
acquiring a set of second estimates of a second SOC of a sensing device connected in series to a battery cell of the battery assembly, the sensing device including a measurement cell having a second battery chemistry that is different than the first battery chemistry, the set of second estimates based on a measurement of the parameter of the sensing device at the set of sample times;
blending the set of first estimates and the set of second estimates to generate a blended SOC relation, the blended SOC relation describing the second SOC of the sensing device as a function of the first SOC of the battery assembly;
filtering the set of first estimates using the blended SOC relation to generate a final estimate of the SOC of the battery assembly, the final estimate having an accuracy that is greater than an accuracy of the set of first estimates; and
controlling a charging operation based on the final estimate of the SOC of the battery assembly.

18. The vehicle system of claim 17, wherein the filtering is performed using a Kalman filter algorithm.

19. The vehicle system of claim 17, wherein the blending is based on a ratio of a capacity of the battery assembly to a capacity of the sensing device, and the blended SOC relation is represented by:

$$SOC_{SD}(k) = \left(CAP_{BP}/CAP_{SD}\right) * SOC_{BP}(k) + d\ \% + v(i,\ T),$$

wherein $SOC_{SD}(k)$ is a state of charge of the sensing device for a plurality of measurement times k, $CAP_{BP}$ is a capacity of the battery assembly, $CAP_{SD}$ is a capacity of the sensing device, d % is a minimum charge offset, $SOC_{BP}(k)$ is a state of the charge of the battery assembly, and v(i,T) is a noise model of the sensing device based on a current i and a temperature T.

20. The vehicle system of claim 17, wherein the set of first estimates is acquired based on a Coulomb counting process, and the set of second estimates is acquired based on a Coulomb counting process in combination with a battery state estimation process.

* * * * *